(12) United States Patent
Kim et al.

(10) Patent No.: US 9,287,503 B2
(45) Date of Patent: Mar. 15, 2016

(54) DISPLAY SUBSTRATE AND METHOD OF MANUFACTURING THE SAME

(71) Applicant: Samsung Display Co., Ltd., Yongin, Gyeonggi-do (KR)

(72) Inventors: Seong Min Kim, Suwon-si (KR); Jun Ho Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/750,728

(22) Filed: Jun. 25, 2015

(65) Prior Publication Data

US 2015/0295177 A1    Oct. 15, 2015

Related U.S. Application Data

(62) Division of application No. 14/017,028, filed on Sep. 3, 2013, now Pat. No. 9,099,413.

(30) Foreign Application Priority Data

Feb. 15, 2013    (KR) .................. 10-2013-0016422

(51) Int. Cl.
*H01L 21/66* (2006.01)
*H01L 51/00* (2006.01)
*H01L 27/32* (2006.01)
*H01L 51/56* (2006.01)

(52) U.S. Cl.
CPC ............ *H01L 51/0021* (2013.01); *H01L 22/12* (2013.01); *H01L 22/30* (2013.01); *H01L 27/3241* (2013.01); *H01L 27/3244* (2013.01); *H01L 51/0031* (2013.01); *H01L 51/56* (2013.01); *H01L 2227/323* (2013.01)

(58) Field of Classification Search
CPC ................. H01L 2924/12041; H01L 27/1214; H01L 21/66; H01L 27/32; H01L 22/12; H01L 22/30; H01L 27/3241; H01L 27/3244; H01L 2227/323
USPC ............................. 438/14–15, 11, 82, 99, 18
See application file for complete search history.

(56) References Cited

U.S. PATENT DOCUMENTS 5,268,587 A * 12/1993 Murata ............. H01L 27/10805
257/357
8,809,876 B2    8/2014 Bradley et al.

(Continued)

FOREIGN PATENT DOCUMENTS

| KR | 10-2008-0062168 | 7/2008 |
| KR | 10-2012-0047811 | 5/2012 |
| KR | 10-2012-0110280 | 10/2012 |

*Primary Examiner* — Thanh T Nguyen
(74) *Attorney, Agent, or Firm* — Lewis Roca Rothgerber Christie LLP

(57) ABSTRACT

A display substrate and a method of manufacturing the same. The display substrate includes a substrate including an active area and an inactive area, an organic light-emitting diode (OLED) unit disposed on the active area of the substrate, and a transmittance measurement pattern unit disposed on the inactive area of the substrate. The transmittance measurement pattern unit includes a deposition assistant layer pattern disposed on the substrate.

19 Claims, 12 Drawing Sheets

(56) References Cited

U.S. PATENT DOCUMENTS

| | | |
|---|---|---|
| 8,981,350 B2 | 3/2015 | Hsieh |
| 2006/0175621 A1* | 8/2006 | Ohtsuka ................ H01L 27/156 257/88 |
| 2007/0075329 A1* | 4/2007 | Kim .................... H01L 27/3276 257/103 |
| 2012/0001885 A1* | 1/2012 | Kang .................... H01L 27/329 345/211 |
| 2012/0013819 A1 | 1/2012 | Son et al. |
| 2013/0258234 A1* | 10/2013 | Park .................. G02F 1/133512 349/58 |
| 2014/0049721 A1 | 2/2014 | Huang et al. |
| 2014/0299884 A1 | 10/2014 | Park et al. |

\* cited by examiner

DISPLAY SUBSTRATE AND METHOD OF MANUFACTURING THE SAME

CROSS-REFERENCE TO RELATED APPLICATION

This application is a divisional of U.S. patent application Ser. No. 14/017,028, filed on Sep. 3, 2013, which claims priority to and the benefit of Korean Patent Application No. 10-2013-0016422, filed on Feb. 15, 2013 in the Korean Intellectual Property Office, the contents of both of which are incorporated herein by reference in their entirety.

BACKGROUND

1. Field

The present invention relates to a display substrate and a method of manufacturing the same.

2. Description of the Related Art

With the development of display technology, display devices are being widely used in portable devices (such as notebook computers, mobile phones and portable media players (PMPs)) as well as display devices for homes (such as TVs and monitors). In particular, the trend toward lighter and thinner display devices is increasing the popularity of liquid crystal display (LCD) devices, organic light-emitting display devices, etc.

An organic light-emitting display device is a self-emissive display device in which a voltage is applied to an anode, a cathode and an organic light-emitting layer disposed between the anode and the cathode, such that electrons and holes are recombined in the organic light-emitting layer so as to emit light.

Recent research has been directed to providing a large display using the organic light-emitting display device. However, the large display increases a wiring resistance of an electrode that covers all pixels, and the increased wiring resistance causes a voltage drop, resulting in luminance non-uniformity. Also, power consumption is increased.

To address the above problems, it has been suggested to form an auxiliary electrode in order to prevent a voltage drop of an electrode. However, an organic layer or an electrode of an organic light-emitting display device can be damaged in the process of forming the auxiliary electrode.

SUMMARY

Aspects of embodiments of the present invention are directed toward a display substrate and a method of manufacturing the same, in which a voltage drop can be prevented or reduced by forming a conductive layer (e.g. an auxiliary electrode).

Aspects of embodiments of the present invention are also directed toward a display substrate and a method of manufacturing the same, in which an organic layer or an electrode can be prevented from being damaged (or damage to the organic layer or the electrode can be reduced) during a process of forming a conductive layer (e.g. an auxiliary electrode).

Aspects of embodiments of the present invention are also directed toward a display substrate and a method of manufacturing the same, in which a reduction in transmittance can be detected by measuring transmittance after formation of a conductive layer (e.g. an auxiliary electrode).

However, aspects of embodiments of the present invention are not restricted to those set forth herein. The above and other aspects of the present invention will become more apparent to one of ordinary skill in the art to which the present invention pertains with reference to the detailed description and the drawings.

In an embodiment, a display substrate is provided, the display substrate includes a substrate, the substrate having an active area and an inactive area; an organic light-emitting diode (OLED) unit on the active area of the substrate; and a transmittance measurement pattern unit on the inactive area of the substrate, wherein the transmittance measurement pattern unit includes a deposition assistant layer pattern on the substrate.

In one embodiment, the deposition assistant layer pattern includes 8-quinolinolato lithium, N,N-diphenyl-N,N-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, or 2-(4-(9,10-di(naphthalene-2-yl)anthracene-2-yl)phenyl)-1-phenyl-1H-benzo-[D]imidazole.

In one embodiment, the transmittance measurement pattern unit further includes a conductive layer pattern on the deposition assistant layer pattern.

In one embodiment, the conductive layer pattern includes Mg.

In one embodiment, the OLED unit includes: a thin-film transistor (TFT) on the substrate; a first insulating layer covering the TFT; a first electrode on the first insulating layer and electrically connected to the TFT; a second insulating layer on the first insulating layer, the second insulating layer covering a first portion of the first electrode and having an opening exposing a second portion of the first electrode; an organic light-emitting layer on a portion of the second insulating layer and on the second portion of the first electrode exposed through the opening; a second electrode on the second insulating layer and the organic light-emitting layer; a deposition assistant layer on a first region of the second electrode; and a conductive layer electrically connected to the second electrode, the conductive layer being on a second region of the second electrode, which excludes the first region of the second electrode.

In one embodiment, the second electrode is a light-transmissive thin film.

In one embodiment, the second electrode includes a metal selected from Ag, Mg, Al, Pt, Pd, Au, Ni, Nd, Ir, Cr, Li, Ca and an alloy thereof.

In one embodiment, the conductive layer contacts side surfaces of edges of the deposition assistant layer.

In one embodiment, the conductive layer includes Mg.

In one embodiment, a thickness of the conductive layer is equal to or greater than a thickness of the second electrode.

In one embodiment, the deposition assistant layer is formed of a light-transmitting material.

In one embodiment, the deposition assistant layer includes 8-quinolinolato lithium, N,N-diphenyl-N,N-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, or 2-(4-(9,10-di(naphthalene-2-yl)anthracene-2-yl)phenyl)-1-phenyl-1H-benzo-[D]imidazole.

In one embodiment, adhesion between the conductive layer and the deposition assistant layer is weaker than adhesion between the conductive layer and the second electrode.

In one embodiment, the OLED unit includes a transmission region configured to transmit external light and a pixel region adjacent to the transmission region, wherein all or part of the transmission region and the pixel region are located in the first region of the second electrode, and wherein the first electrode overlaps the pixel region.

In one embodiment, the first electrode overlaps and hides the TFT.

In one embodiment, a ratio of an area of the transmission region to the sum of an area of the pixel region and the area of the transmission region is in a range of 5 to 90%.

In another embodiment, a method of manufacturing a display substrate is provided. The method includes forming a TFT on a substrate, the substrate including an active area and an inactive area, the forming of the TFT being on the active area of the substrate; forming an OLED electrically connected to the TFT and including a first electrode, an organic light-emitting layer and a second electrode; concurrently or simultaneously forming a deposition assistant layer on a first region of the second electrode with a deposition assistant layer pattern on the inactive area of the substrate; concurrently or simultaneously forming a conductive layer electrically connected to the second electrode, the forming of the conductive layer including depositing a conductive material on a second region of the second electrode, which excludes the first region, with a transmittance measurement pattern unit, the depositing of the transmittance measurement pattern unit including depositing the conductive material on the deposition assistant layer pattern; and measuring transmittance of the transmittance measurement pattern unit to determine whether a defect is present.

In one embodiment, the forming of the deposition assistant layer and the deposition assistant layer pattern includes using a mask having openings corresponding to regions in which the deposition assistant layer and the deposition assistant layer pattern are to be formed.

In one embodiment, the forming of the conductive layer and the transmittance measurement pattern unit includes using a mask having openings corresponding to the active area and the transmittance measurement pattern unit.

In one embodiment, the measuring of the transmittance is performed directly after the forming of the conductive layer.

In one embodiment, the measuring of the transmittance is performed within a deposition chamber in which the conductive material is deposited.

In one embodiment, the measuring of the transmittance is performed while the substrate having the conductive material deposited thereon is being transferred.

In one embodiment, the measuring of the transmittance includes: irradiating light to the transmittance measurement pattern with a light emitter on a first side of the substrate; and receiving light transmitted through the substrate and the transmittance measurement pattern with a light receiver on a second side of the substrate, facing oppositely away from the first side.

In one embodiment, light irradiated from the light emitter to the transmittance measurement pattern unit is perpendicular to the substrate.

In one embodiment, the second electrode is formed as a light-transmissive thin film.

In one embodiment, the second electrode includes a metal selected from Ag, Mg, Al, Pt, Pd, Au, Ni, Nd, Ir, Cr, Li, Ca, and an alloy thereof.

In one embodiment, the conductive material includes Mg.

In one embodiment, a thickness of the conductive layer is equal to or greater than a thickness of the second electrode.

In one embodiment, the deposition assistant layer and the deposition assistant layer pattern includes a light-transmitting material.

In one embodiment, the deposition assistant layer and the deposition assistant layer pattern comprise 8-quinolinolato lithium, N,N-diphenyl-N,N-bis(9-phenyl-9H-carbazol-3-yl) biphenyl-4,4'-diamine, N(diphenyl-4-yl)9,9-dimethyl-N-(4 (9-phenyl-9H-carbazol-3-yl)phenyl)-9H-fluorene-2-amine, or 2-(4-(9,10-di(naphthalene-2-yl)anthracene-2-yl)phenyl)-1-phenyl-1H-benzo-[D]imidazole.

In one embodiment, adhesion between the conductive layer and the deposition assistant layer is weaker than adhesion between the conductive layer and the second electrode.

In one embodiment, the active area includes a transmission region configured to transmit external light and a pixel region adjacent to the transmission region, wherein all or part of the transmission region and the pixel region are located in the first region of the second electrode, and wherein the first electrode is formed to overlap the pixel region.

In one embodiment, the first electrode is formed to overlap and hide the TFT.

In one embodiment, the transmission region is formed such that a ratio of an area of the transmission region to the sum of an area of the pixel region and the area of the transmission region is in a range of 5 to 90%.

In one embodiment, the method further includes outputting an alarm signal based on detection of the defect.

BRIEF DESCRIPTION OF THE DRAWINGS

The above and other aspects and features of the present invention will become more apparent by reference to the following detailed description when considered in conjunction with the accompanying drawings, in which.

DETAILED DESCRIPTION

Figure 1:
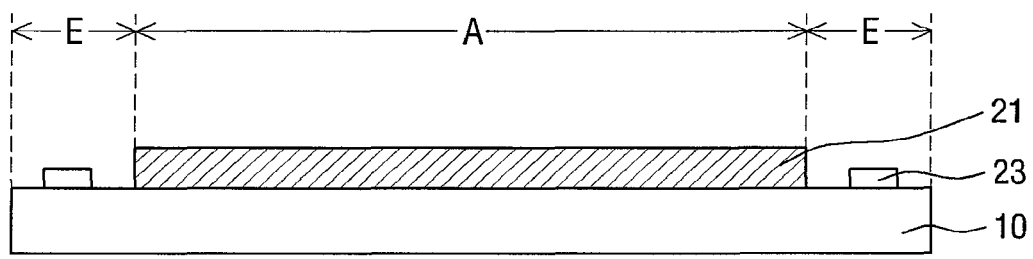
FIG. 1 is a cross-sectional view of a display substrate according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Advantages and features of the present invention may be understood more readily by reference to the following detailed description of embodiments and the accompanying drawings. The present invention may, however, be embodied in many different forms and should not be construed as being limited to the embodiments set forth herein. Rather, these embodiments are provided by way of example.

It will be understood that when an element (e.g. a layer) is referred to as being "on" another element, the element can be directly on the second element, or can be indirectly on the second element, with one or more intervening elements interposed therebetween. Like reference numerals refer to like elements throughout the application.

It will also be understood that, although terms such as "first", "second", "third", or the like, are be used herein to describe various elements or portions thereof, these elements or portions thereof are not limited by these terms. Instead these terms are only used to distinguish one element or portion thereof from another element or portion thereof. For example, a first element discussed below could be termed a second element without departing from the teachings of the present invention.

Hereinafter, embodiments of the present invention will be described with reference to the attached drawings.

Figure 2:
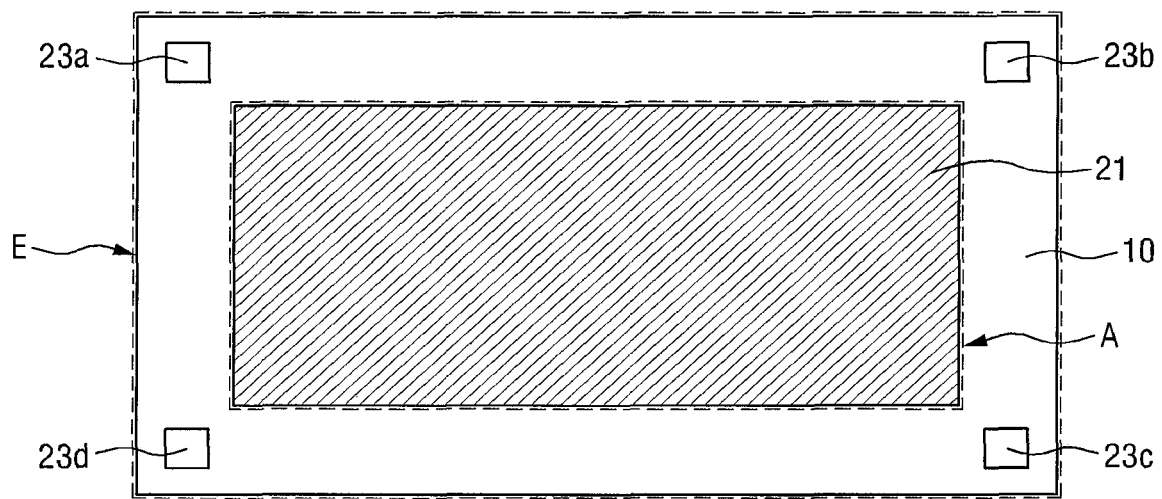
FIG. 2 is a plan view of the display substrate shown in FIG. 1.

FIG. 1 is a cross-sectional view of a display substrate according to an embodiment of the present invention. FIG. 2 is a plan view of the display substrate shown in FIG. 1.

Referring to FIG. 1, the display substrate according to an embodiment of the present invention may include a substrate 10, an organic light-emitting diode (OLED) unit 21, and transmittance measurement pattern units 23.

The substrate 10 may be formed of a transparent material with insulating and light-transmitting properties. The substrate 10 may be a transparent insulating substrate formed of glass, quartz, ceramic, or the like, or may be a transparent flexible substrate formed of plastic, or the like.

An active area A and an inactive area E may be defined in the substrate 10. That is, in one embodiment, the substrate 10 has an active area A and an inactive area E. The active area A may be an area on which the OLED unit 21 is located. The inactive area E may be an area of the substrate 10 excluding the active area A. For example, the inactive area E may be defined at edges of the substrate 10 which surround the active area A.

The OLED unit 21 includes one or more pixels which emit light. The OLED unit 21 will be described later.

The transmittance measurement pattern units 23 may measure the transmittance of the display substrate in order to determine whether the transmittance of the display substrate is defective, that is, to determine whether or not a defect is present. The transmittance measurement pattern units 23 may be formed on the inactive area E of the substrate 10. Referring to FIG. 2, transmittance measurement pattern units 23a through 23d may respectively be placed at corners of the inactive area E of the substrate 10. However, this is only an example and other placements of the transmittance measurement pattern units 23a through 23d can be used. That is, the positions of the transmittance measurement pattern units 23 (see FIG. 1) are not specifically limited, as long as they are within the inactive area E of the substrate 10. The number of the transmittance measurement pattern units 23 is also not specifically limited.

Figure 3:
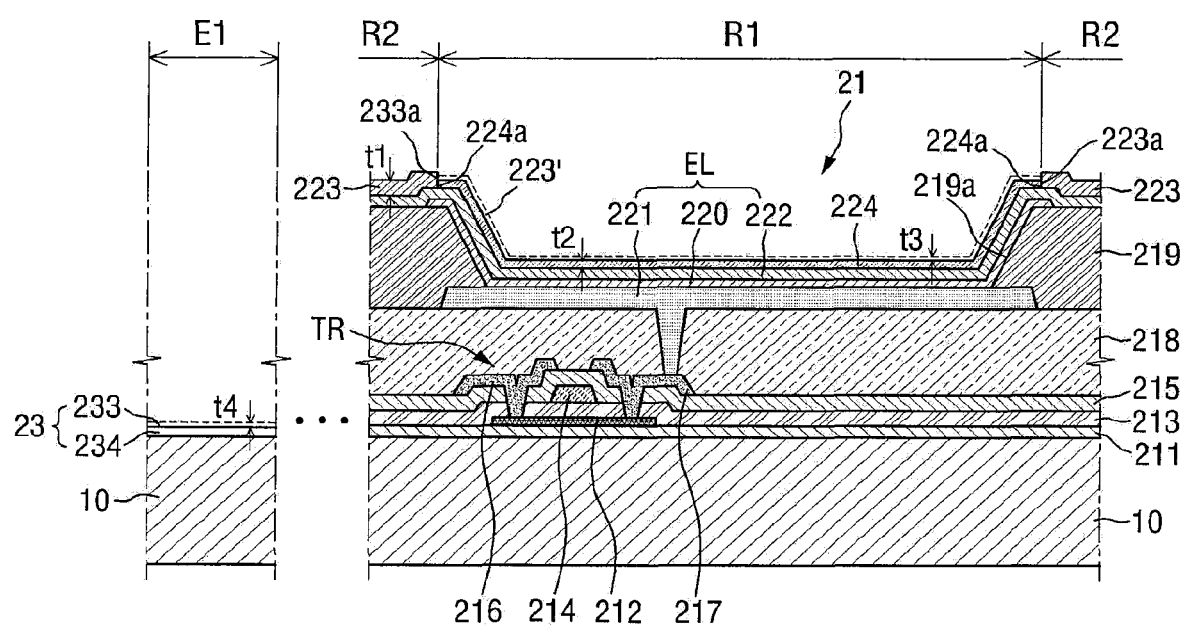
FIG. 3 is a cross-sectional view of an organic light-emitting diode (OLED) unit and a transmittance measurement pattern unit included in the display substrate of FIG. 1.

FIG. 3 is a cross-sectional view of the OLED unit 21 and the transmittance measurement pattern units 23 included in the display substrate of FIG. 1. More specifically, a cross-section of one pixel included in the OLED unit 21 and a cross-section of one transmittance measurement pattern unit 23 formed in the display substrate are illustrated as an example.

Referring to FIG. 3, a buffer layer 211 and a thin-film transistor (TFT) TR may be formed on the active area A (see FIG. 1) of the substrate 10.

The buffer layer 211 may prevent or reduce penetration of impurity elements and planarize the surface. Thus, the buffer layer 211 may be formed of various suitable materials capable of performing these functions. For example, the buffer layer 211 may be formed of an inorganic material such as silicon oxide, silicon nitride, silicon oxynitride, aluminum oxide, aluminum nitride, titanium oxide or titanium nitride, or an organic material such as polyimide, polyester, acrylate, or a stack of these organic materials. However, these are only examples, and the buffer layer 211 can be formed using any suitable materials suitable to prevent or reduce penetration of impurity elements and planarize the surface. In some embodiments, the buffer layer 211 is omitted.

The TFT TR may be formed on the buffer layer 211. The TFT TR may include a semiconductor active layer 212, a gate insulating layer 213, a gate electrode 214, a source electrode 216 and a drain electrode 217.

The semiconductor active layer 212 may be formed on the buffer layer 211. The semiconductor active layer 212 may be formed of polycrystalline silicon, however, embodiments of the present invention are not limited thereto, and the semiconductor active layer 212 may also be formed of an oxide semiconductor. For example, the semiconductor active layer 212 may be, but is not limited to, a G-I-Z-O layer[$(In_2O_3)a(Ga_2O_3)b(ZnO)c$ layer], where a, b and c are real numbers that satisfy a≥0, b≥0, and c>0, respectively. A semiconductor oxide layer 212 formed of an oxide semiconductor may have increased light transmittance.

The gate insulating layer 213 may be formed on the buffer layer 211 to cover the semiconductor active layer 212, and the gate electrode 214 may be formed on the gate insulating layer 213.

The gate insulating layer 213 may be formed of silicon oxide ($SiO_x$), silicon nitride (SiNx), or silicon oxynitride (SiON). Specifically, the gate insulating layer 213 may be formed of a single layer or a multilayer. The gate insulating layer 213 formed of a multilayer may have a stacked structure of SiNx and SiOx. In these embodiments, a portion of the gate insulating layer 213 which contacts the semiconductor active layer 212 may be formed of a SiOx layer, and a SiNx layer may be disposed under the SiOx layer. The SiOx layer in contact with the semiconductor active layer 212 can prevent or reduce deterioration of the semiconductor active layer 212. If the gate insulating layer 213 is formed of a SiON layer, the SiON layer may be made to have an oxygen concentration distribution. In these embodiments, oxygen concentration may be made to increase as the distance to the semiconductor active layer 212 decreases, thereby preventing or reducing the deterioration of the semiconductor active layer 212.

The gate electrode 214 may be formed of an aluminum (AO-based metal, such as aluminum or an aluminum alloy, a silver (Ag)-based metal, such as silver or a silver alloy, a copper (Cu)-based metal, such as copper or a copper alloy, a molybdenum (Mo)-based metal, such as molybdenum or a molybdenum alloy, chrome (Cr), titanium (Ti) or tantalum (Ta), but is not limited thereto. In addition, the gate electrode 214 may have a multilayer structure including, for example, two conductive layers with different physical characteristics. For example, one of the two conductive layers may be formed of a metal with low resistivity, such as an aluminum-based metal, a silver-based metal or a copper-based metal, in order to reduce a signal delay or a voltage drop of the gate electrode 214. The other one of the two conductive layers may be formed of a different material, in particular, a material having superior contact characteristics with indium tin oxide (ITO) and indium zinc oxide (IZO), such as a molybdenum-based metal, chrome, titanium, or tantalum. Examples of the multilayer structure include a chrome lower layer and an aluminum upper layer, an aluminum lower layer and a molybdenum upper layer, and a titanium lower layer and a copper upper layer. However, the present invention is not limited thereto, and the gate electrode 214 may be formed of various suitable metals and conductors.

An interlayer insulating film 215 may be formed on the gate insulating layer 213 to cover the gate electrode 214, and the source electrode 216 and the drain electrode 217 may be formed on the interlayer insulating film 215 and may contact the semiconductor active layer 212 via contact holes, respectively.

The source electrode 216 and the drain electrode 217 may have a single layer structure including Ni, Co, Ti, Ag, Cu, Mo, Al, Be, Nb, Au, Fe, Se or Ta, or may have a multilayer structure including Ni, Co, Ti, Ag, Cu, Mo, Al, Be, Nb, Au, Fe, Se and/or Ta. In addition, an alloy including of one of the above metals and one or more elements selected from Ti, Zr, W, Ta, Nb, Pt, Hf, O and N can be used. Examples of the multilayer structure include, but are not limited to a double layer such as Ti/Cu, Ta/Al, Ta/Al, Ni/Al, Co/Al or Mo(Mo alloy)/Cu and a triple layer such as Mo/Al/Mo, Ti/Al/Ti, Ta/Al/Ta, Ti/Al/TiN, Ta/Al/TaN, Ni/Al/Ni or Co/Al/Co. However, these are only examples. The material that forms the source electrode 216 and the drain electrode 217 is not limited to the above materials, and the structure of the source electrode 216 and the drain electrode 217 is not limited to the above structures.

The TFT TR is not necessarily structured as described above, and various structures can be applied to the TFT TR. For example, the TFT TR may have a top-gate structure. However, this is only an example, and the TFT TR may also have a bottom-gate structure in which the gate electrode 214 is disposed under the semiconductor active layer 212. For example, any suitable TFT structures for a display device can be used.

In FIG. 3, one TFT TR is illustrated. However, the pixel may further include one or more other TFTs and a capacitor to form a pixel circuit unit.

A first insulating layer 218 may be formed to cover the TFT TR or the pixel circuit unit including the TFT TR. The first insulating layer 218 may be formed of a single insulating layer or multiple insulating layers having a planarized top surface. The first insulating layer 218 may be formed of an inorganic material and/or an organic material.

A first electrode 221 may be formed on the first insulating layer 218 and may be electrically connected to the pixel circuit unit including the TFT TR. The first electrode 221 may be formed as an independent island in each pixel.

A second insulating layer 219 may be formed on the first insulating layer 218 to cover edges of the first electrode 221. An opening 219a may be formed in the second insulating layer 219 to expose a central portion of the first electrode 221 excluding the edges of the first electrode 221.

An organic layer 220 and a second electrode 222 covering the organic layer 220 may be sequentially formed on the first electrode 221 exposed through the opening 219a. As a result, an OLED EL may be formed.

The organic layer 220 may be formed as a low molecular weight organic layer or a polymer organic layer. When the organic layer 220 is formed as the low molecular weight organic layer, a hole injection layer (HIL), a hole transport layer (HTL), an emission layer (EML), an electron transport layer (ETL), and an electron injection layer (EIL) may be singularly or multiply stacked. The low molecular weight organic layer may be formed by vacuum deposition. Here, the EML is formed independently in each of red, green and blue pixels, and the HIL, HTL, ETL and EIL are common layers that may be commonly applied to the red, green and blue pixels.

The HIL may be formed of a phthalocyanine compound, such as copper phthalocyanine, or a starburst amine such as TCTA, m-MTDATA or m-MTDAPB.

The HTL may be formed of N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

The EIL may be formed of a material such as LiF, NaCl, CsF, $Li_2O$, BaO, Liq, or the like.

The ETL may be formed of tris(8-quinolinorate)aluminum ($Alq_3$), 3-(4-biphenylyl)-4-phenyl-5-(4-tert-butyl phenyl)-1,2,4-triazole (TAZ), or the like.

The EML may include a host material and a dopant material. Examples of the host material may include, but are not limited to tris(8-hydroxy-quinolinato)aluminum (Alq3), 9,10-di(naphth-2-yl)anthracene (AND), 3-tert-butyl-9,10-di(naphth-2-yl) anthracene (TBADN), 4,4'-bis 2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis 9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), and 9,9-bis(9-phenyl-9H-carbazol)fluorene (FL-2CBP).

Examples of the dopant material may include, but are not limited to 4,4'-bis[4-(di-p-tolylamino)styryl]biphenyl (DPAVBi), 9,10-di(naph-2-tyl)anthracene (ADN), and 3-tert-butyl-9,10-di(naph-2-tyl)anthracene (TBADN).

The first electrode 221 may be an anode, and the second electrode 222 may be a cathode. Alternatively, polarities of the first electrode 221 and the second electrode 222 may be reversed.

In one embodiment, the first electrode 221 is a reflective electrode, and the second electrode 222 is a transparent electrode. Accordingly, the OLED EL included in the OLED unit 21 in an embodiment of the present invention, is a top emission type OLED which realizes an image in the direction of the second electrode 222.

To this end, the first electrode 221 may include at least one of ITO, IZO, ZnO and $In_2O_3$, having a high work function. The first electrode 221 may further include a reflective layer formed of Ag, Mg, Al, Pt, Pd, Au, Ni, Nd, Ir, Cr, Li, Yb or Ca.

The second electrode 222 may include a metal having a low work function, for example, a metal selected from Ag, Mg, Al, Pt, Pd, Au, Ni, Nd, Ir, Cr, Li, Ca, and an alloy thereof. In particular, the second electrode 222 may be formed to be light-transmissive and may be formed as a thin film using e.g., Al, Ag and/or Mg. The second electrode 222 may have a structure in which an alloy of Mg and Ag and/or Ag is singularly or multiply stacked. However, this is only an example, and the second electrode 222 may also include a transparent metal oxide, for example, at least one of ITO, IZO, ZnO, and $In_2O_3$.

Unlike the first electrode 221, the second electrode 222 is formed to apply a common voltage to all pixels. To this end, the second electrode 222 is formed as a common electrode which is not patterned for each of the pixels. Alternatively, the second electrode 222 which is a common electrode may be patterned according to a mesh pattern, so that all regions of the second electrode 222 are removed except for a region of the second electrode 222 which corresponds to an emission region.

A deposition assistant layer 224 having first edges 224a may be formed on a first region R1 of the second electrode 222. The deposition assistant layer 224 may prevent the second electrode 223 from being damaged (or reduce damage to the second electrode 223) during a process of forming a conductive layer 223, which will be described later, or during a thin-film encapsulation process and may simplify the process of forming the conductive layer 223.

The conductive layer 223 may be formed on a second region R2 of the second electrode 222 and may be electrically connected to the second electrode 222.

In embodiments where the OLED EL is of a top emission type, the second electrode 222 includes a transparent metal oxide or a thin metal. Therefore, if the second electrode 222 is formed as a common electrode, a sheet resistance of the second electrode 222 increases, causing a voltage drop. To solve this problem, embodiments of the present invention further include the conductive layer 223 which is electrically connected to the second electrode 222. That is, according to an embodiment, since the conductive layer 223 is electrically connected to the second electrode 222, the sheet resistance of the second electrode 222 can be reduced. Accordingly, a voltage drop in the second electrode 222 can be prevented or reduced.

The conductive layer 223 may have second edges 223a, and side surfaces of the first edges 224a of the deposition assistant layer 224 may contact side surfaces of the second edges 223a of the conductive layer 223.

The first region R1 may cover a region in which emission occurs in the one pixel, and a horizontal area of the first region R1 may be greater than that of the region in which emission occurs in at least one pixel. The deposition assistant layer 224 may be formed over the entire first region R1, and edges of the first region R1 may correspond to the first edges 224a of the deposition assistant layer 224. The second region R2 may be a region of the second electrode 222 excluding the first region R1. The conductive layer 223 may be formed over the entire second region R2, and edges of the second region R2 may correspond to the second edges 223a of the conductive layer 223.

A thickness t1 of the conductive layer 223 may be greater than a thickness t2 of the second electrode 222 in order to reduce the sheet resistance of the second electrode 222.

The conductive layer 223 may include Mg. For example, the conductive layer 223 may be formed of Mg or an alloy of Mg and at least one of Al and Ag. Alternatively, the conductive layer 223 may be formed of a same material as the second electrode 222.

Since the deposition assistant layer 224 covers the region in which emission occurs in a pixel, the deposition assistant layer 224 may be formed to be light-transmissive. The deposition assistant layer 224 may be formed as a thin film which in some embodiments is thinner than the conductive layer 223, but is not limited thereto.

In the current embodiment, adhesion between the conductive layer 223 and the deposition assistant layer 224 may be weaker than adhesion between the conductive layer 223 and the second electrode 222.

To this end, the deposition assistant layer 224 may be formed of 8-quinolinolato lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

The conductive layer 223 may include Mg. For example, the conductive layer 223 may be formed of Mg or an alloy of Mg and at least one of Al and Ag. Alternatively, the conductive layer 223 may be formed of a same material as the second electrode 222. By way of example, embodiments where the conductive layer 223 is formed of Mg are be described below. However, embodiments of the present invention are not limited to this example.

Since the conductive layer 223 including Mg and the second electrode 222 include metals, they may have good adhesion. However, Mg included in the conductive layer 223 typically does not adhere well to the kinds of materials that form the deposition assistant layer 224. Therefore, the conductive layer 223 can be patterned more simply by using adhesion characteristics between the conductive layer 223 and the second electrode 222 and between the conductive layer 223 and the deposition assistant layer 224.

As described above, the conductive layer 223 should be patterned so as to be formed only on the second region R.

A comparable method used to pattern a metal layer is a deposition method using a deposition mask having a fine pattern. In this comparable method, however, if a deposition metal accumulates on the fine pattern of the mask, the shape of a metal layer pattern that is actually formed is different from an intended shape. Therefore, the mask should be cleaned continuously in order to prevent or reduce accumulation of the deposition metal.

However, a method of cleaning a metal accumulated on a deposition mask while maintaining a fine pattern of the deposition mask has not been suggested. Therefore, if a pattern shape is changed by the deposition of a metal on the fine pattern, a new mask has to be used. That is, the mask itself has to be replaced, and this causes an increase in product costs.

In an embodiment of the present invention, the conductive layer 223 is patterned more simply by using the adhesion characteristics between the conductive layer 223 and the second electrode 222 and between the conductive layer 223 and the deposition assistant layer 224.

The transmittance measurement pattern unit 23 may be formed on a region E1 of the inactive area E (see FIG. 1) of the substrate 10.

As will be described later, the conductive layer 223 may be formed by depositing a conductive material on the entire surface of the active area A (see FIG. 1) of the substrate 10 which includes the first region R1 and the second region R2. Since the conductive material used to form the conductive layer 223 has weak adhesion to the deposition assistant layer 224, it is theoretical that the conductive layer 223 is not formed on the deposition assistant layer 224 but is formed only on the second electrode 222 having relatively strong adhesion to the conductive material. However, when the conductive layer 223 is formed, the conductive material is deposited on an entire surface of the active area A (see FIG. 1) of the substrate 10 which includes the first region R1 and the second region R2. Thus, a conductive layer thin film 223' may actually be physically laid on the deposition assistant layer 224.

A thickness t3 of the conductive layer thin film 223' may be smaller than the thickness t1 of the conductive layer 223. Therefore, the conductive layer thin film 223' may not greatly affect the luminance of the OLED EL in the first region R1. However, if the thickness t3 of the conductive layer thin film 223' is large enough to affect the luminance of the OLED EL, the transmittance of the display substrate may be lower than reference transmittance. Consequently, this can cause a defect in a display device including the display substrate.

In embodiments of the present invention, since the transmittance measurement pattern unit 23 is formed on the inactive area E (see FIG. 1) of the substrate 10, a transmittance defect can be detected during the process of manufacturing the display substrate. This can prevent or reduce creation of additional defects and, ultimately, reduce defects of a display device including the display substrate.

The transmittance measurement pattern unit 23 may include a deposition assistant layer pattern 234 formed on the substrate 10 and may further include a conductive layer pattern 233 formed on the deposition assistant layer pattern 234.

The deposition assistant layer pattern 234 may be formed of a same material as the deposition assistant layer 224 and may be formed at a same time as the deposition assistant layer 224.

The conductive layer pattern 233 may be formed of a same material as the conductive layer 223 and may be formed at a same time as the conductive layer 223.

For example, when the result of measuring the transmittance of the transmittance measurement pattern unit 23 is equal to or greater than a set value or within a set normal range, it may be determined that the display substrate is not defective, and subsequent processes may be performed.

However, when the result of measuring the transmittance of the transmittance measurement pattern unit 23 is less than the set value or within a set abnormal range, it may be determined that the display substrate is defective. Therefore, the subsequent processes may not be performed, or a process of repairing the defect may be performed.

The transmittance of the transmittance measurement pattern unit 23 may be related to a thickness of the conductive layer pattern 233 that may be formed on the deposition assistant layer pattern 234. The deposition assistant layer pattern 234 and the deposition assistant layer 224 are formed of a same material, and. In addition, since the deposition assistant layer pattern 234 and the deposition assistant layer 224 are placed within a same chamber in the process of forming the conductive layer 223, they are under a same set of environmental conditions. That is, if the conductive layer pattern 233 is formed on the deposition assistant layer pattern 234 under the same set of environmental conditions as the deposition assistant layer 224, it is likely that the conductive layer thin film 223' is also formed on the deposition assistant layer 224 and that a thickness t4 of the conductive layer pattern 233 is equal to or substantially equal to the thickness t3 of the conductive layer thin film 223'.

Therefore, if the transmittance of the transmittance measurement pattern unit 23 is measured, it can be identified whether the conductive layer thin film 223' has been formed on the deposition assistant layer 224 and, if the conductive layer thin film 223' has been formed, whether the thickness t3 of the conductive layer thin film 223' is large enough to affect the luminance of the OLED EL.

As described above, since the transmittance measurement pattern unit 23 is formed on the inactive area E in which transmittance can be measured relatively easily, the occurrence of a transmittance defect can be detected easily. In addition, since the occurrence of a transmittance defect can be detected directly (e.g. immediately) after the process of forming the conductive layer 223, follow-up measures can be taken more easily.

FIGS. 4 through 9 are views sequentially illustrating processes of a method of manufacturing a display substrate according to an embodiment of the present invention.

Figure 4:
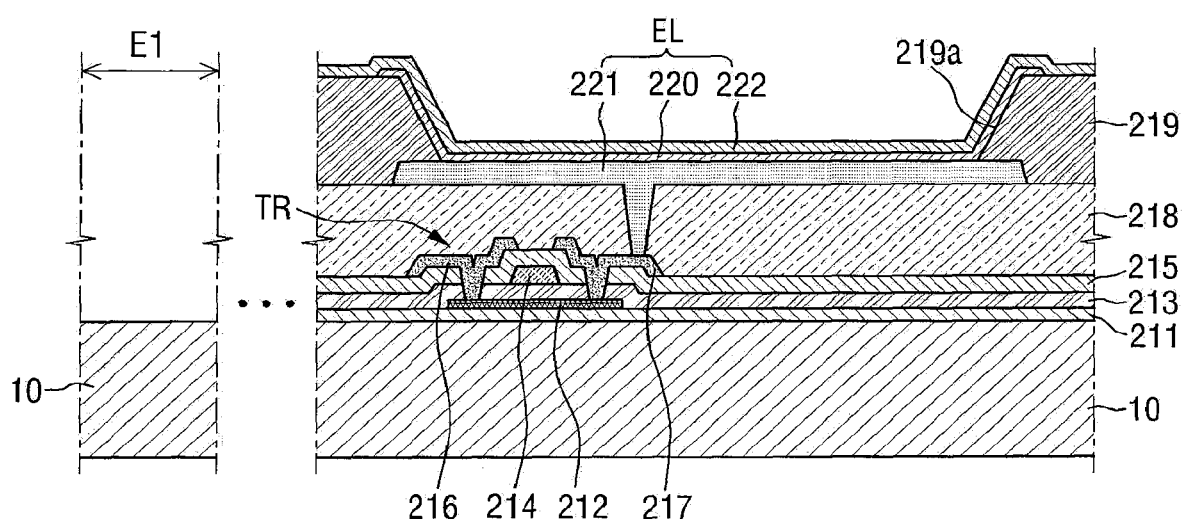
FIGS. 4 through 9 are views sequentially illustrating a method of manufacturing a display substrate according to an embodiment of the present invention.

Referring to FIG. 4, a buffer layer 211, a TFT TR, a first insulating layer 218, a first electrode 221, a second insulating layer 219, an organic layer 220, and a second electrode 222 are formed on an active area A (see FIG. 1) of a substrate 10. These elements are already described with reference to FIG. 3.

Figure 5:
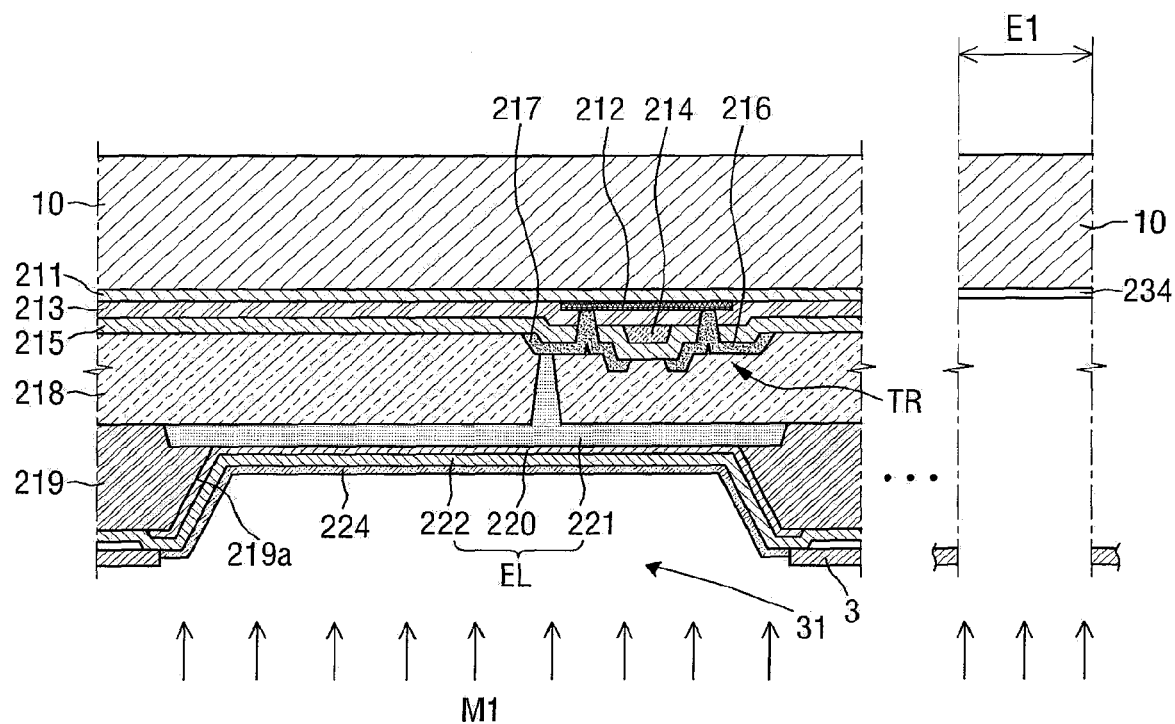

Referring to FIG. 5, a deposition assistant layer 224 may be formed on a first region of the second electrode 222, and deposition assistant layer patterns 234 may be formed on regions E1 of an inactive area E of the substrate 10 at a same time as the formation of the deposition assistant layer 224. The deposition assistant layer 224 and the deposition assistant layer patterns 234 may be formed of the organic material described above with reference to FIG. 3 and may be formed by a thermal evaporation method using a mask 3. The mask 3 may include an opening 31 corresponding to a position at which the deposition assistant layer 224 is to be formed and openings 33 corresponding to positions at which the deposition assistant layer patterns 234 are to be formed. In one embodiment, an organic material M1 is deposited through the openings 31 and 33, thereby concurrently or simultaneously forming the deposition assistant layer 224 and the deposition assistant layer patterns 234.

Figure 6:
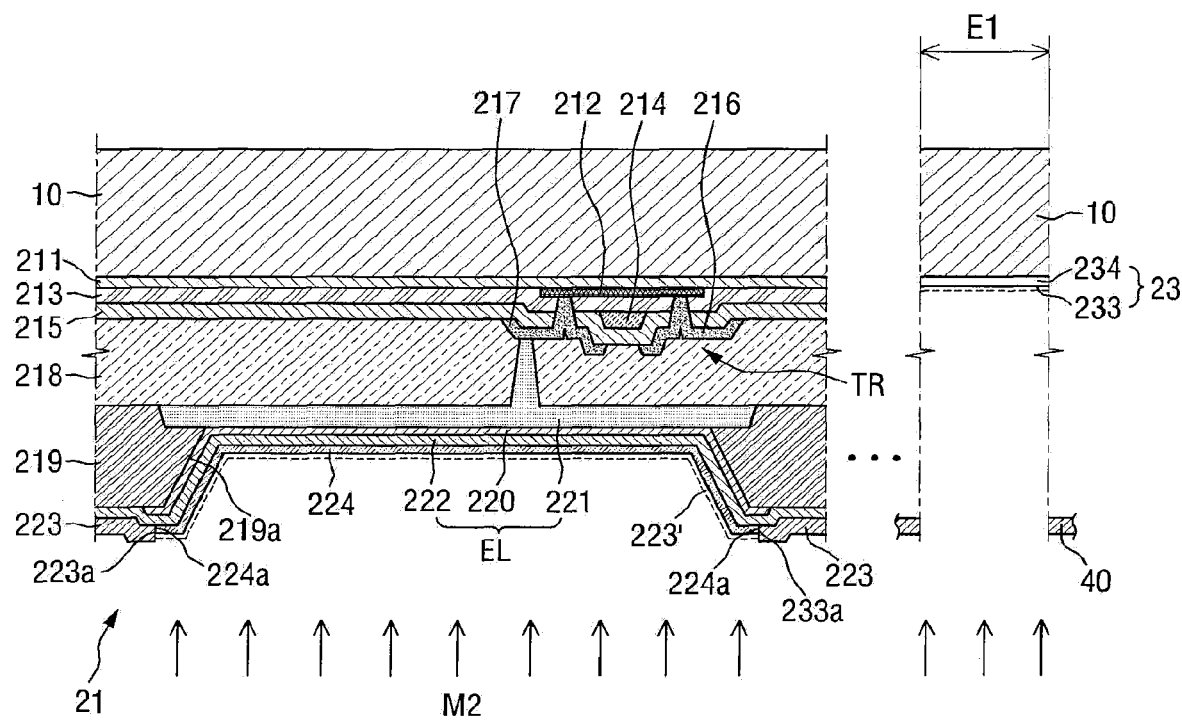
Figure 7:
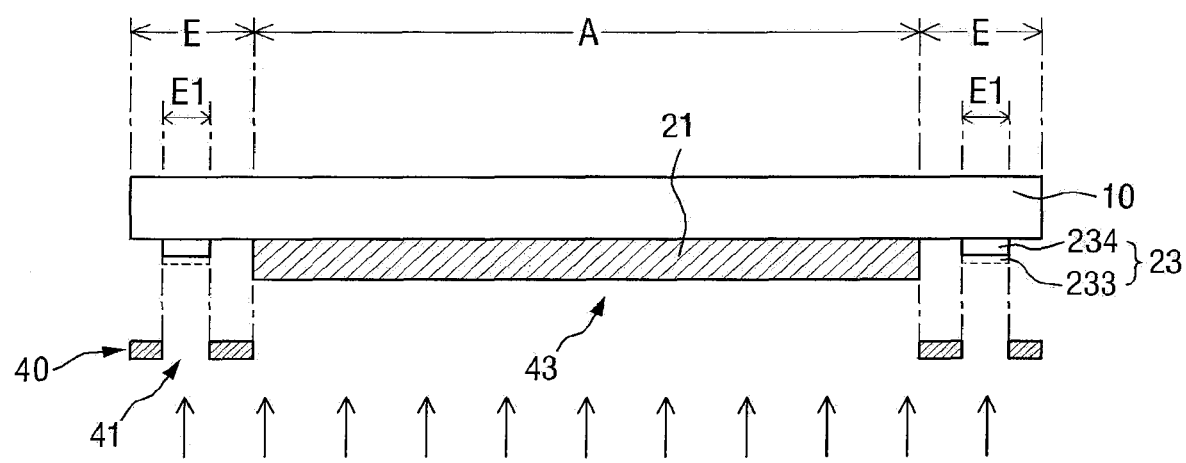

Referring to FIG. 6, a material M2 for forming a conductive layer 223 is deposited on an entire surface of the substrate 10. Here, the material M2 for forming the conductive layer 223 may be deposited using a mask 40 shown in FIG. 7. The mask 40 used to deposit the material M2 for forming the conductive layer 223 may include an opening 43 corresponding to the active area A of the substrate 10 and openings 41 corresponding to regions of the inactive area E of the substrate 10 in which the deposition assistant layer patterns 234 are formed, that is, regions in which transmittance measurement pattern units 23 are to be formed.

Figure 10:
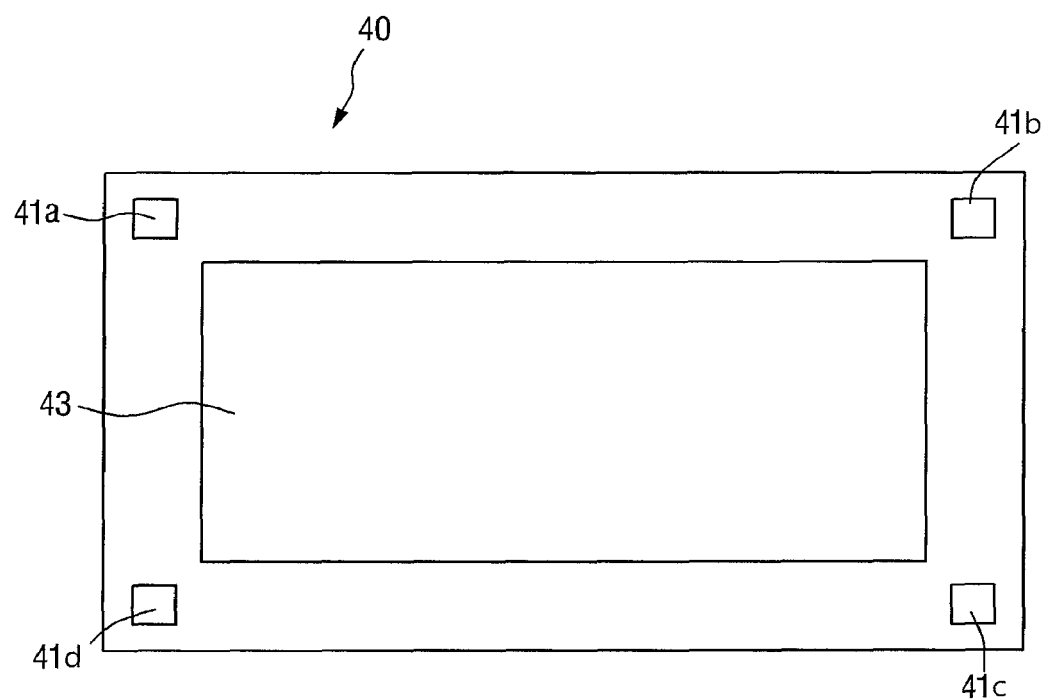
FIG. 10 is a schematic plan view of a mask used in the method illustrated in FIG. 7.

A structure of the mask 40 and the positions of the openings 41 are not specifically limited. For example, referring to FIGS. 2 and 10, if transmittance measurement pattern units 23a through 23d are respectively formed at corners of the inactive area E (see FIG. 2) of the substrate 10 as shown in FIG. 2, the mask 40 may include an opening 43, which corresponds to the active area A (see FIG. 2) of the substrate 10, in a central portion thereof and a plurality of openings 41a through 41d, which correspond to the transmittance measurement pattern units 23a through 23d of FIG. 2, at corners thereof, respectively. However, this is only an example and the shape of the mask 40 and the positions of the openings 41 may vary according to the positions at which the transmittance measurement pattern units 23 are to be formed.

Referring back to FIG. 6, the material M2 for forming the conductive layer 223, in some embodiments, does not adhere well to the deposition assistant layer 224, as described above with reference to FIG. 3. Therefore, in some embodiments, the conductive layer 223 is not formed on the deposition assistant layer 224 but is formed only on the second electrode 222 having relatively strong adhesion to the material M2. Accordingly, the conductive layer 223 can be formed at a desired position without an additional patterning process.

If the material M2 for forming the conductive layer 223 is deposited as shown in FIG. 6, not only is the conductive layer 223 formed in regions other than the deposition assistant layer 224, but a conductive layer thin film 223' may also be formed on the deposition assistant layer 224. In some embodiments, since the material M2 for forming the conductive layer 223 has weak adhesion to the deposition assistant layer 224, it is not deposited on the deposition assistant layer 224 but is deposited only on the second electrode 222 having relatively strong adhesion to the material M2. However, since in some embodiments, the process of FIG. 6 is performed without using an additional patterning mask but by only using the mask 4, which includes the aperture 41 corresponding to the active area A (see FIG. 7), the conductive layer thin film 223' can be physically laid on the deposition assistant layer 224.

A thickness t3 of the conductive layer thin film 223' may be smaller than a thickness t1 of the conductive layer 223.

If the conductive layer thin film 223' is formed on the deposition assistant layer 224, conductive layer patterns 233 may also be formed on the deposition assistant layer patterns 234, respectively. That is, the transmittance measurement pattern units 23 may include the deposition assistant layer patterns 234 and, if the conductive layer patterns 233 are additionally formed, may further include the conductive layer patterns 233, respectively.

Figure 8:
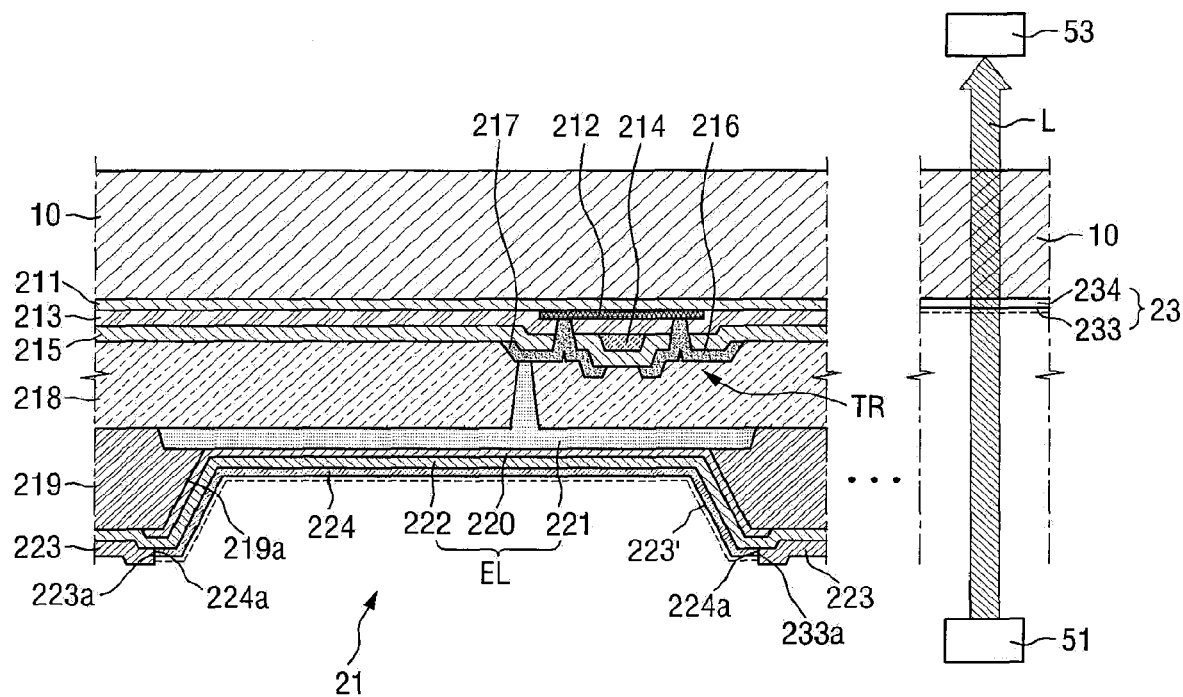

Referring to FIG. 8, respective transmittances of the transmittance measurement pattern units 23 are measured using defect sensors (51, 53) to determine whether a display substrate is defective. In one embodiment, the defect sensors (51, 53) are designed to detect a transmittance defect of the display substrate. In one embodiment, the defect sensors (51, 53) are located at positions respectively corresponding to the transmittance measurement pattern units 23 as illustrated in FIG. 9.

Each of the defect sensors (51, 53) may include a pair of a light emitter 51 and a light receiver 53. In one embodiment, the light emitter 51 irradiates a set amount of light to a corresponding transmittance measurement pattern unit 23, and the light receiver 53 receives light irradiated from the light emitter 51.

Figure 9:
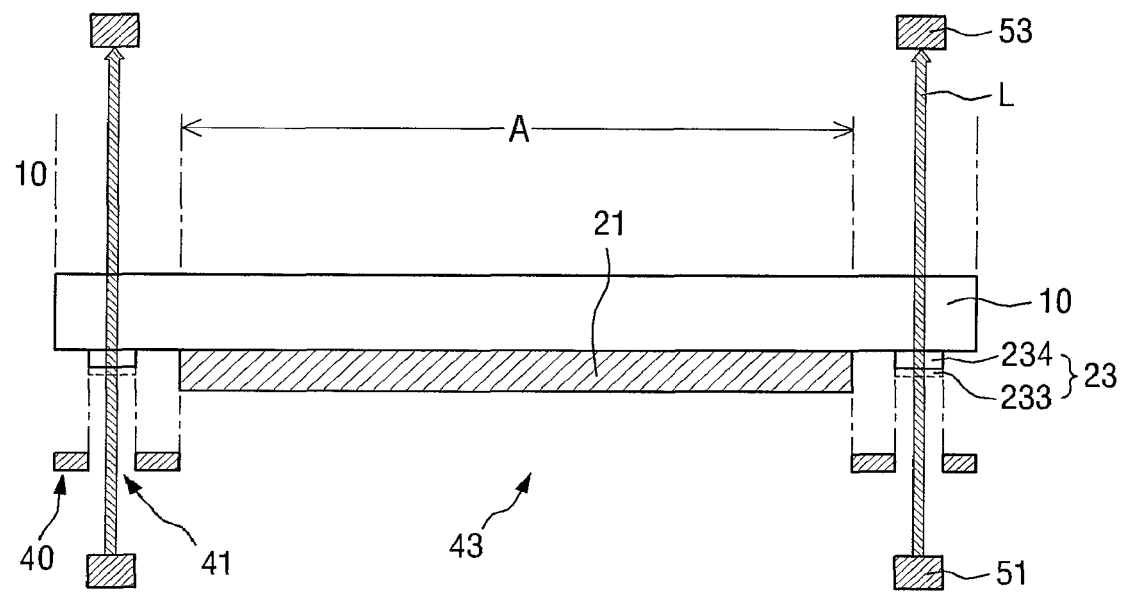

As illustrated in FIGS. 8 and 9, the defect sensors (51, 53) may be transmissive optical sensors. Unlike a reflective optical sensor in which a light emitter and a light receiver are located in the same direction, a transmissive optical sensor includes a light emitter and a light receiver which face each other with an object to be sensed therebetween. Therefore, the light emitter 51 may be located under the substrate 10, and the light receiver 53 may be located above the substrate 10. The light emitter 51 and the light receiver 53 may be placed to face each other such that light emitted from the light emitter 51 can be received by the light receiver 53. However, this is only an example and the positions of the light emitter 51 and the light receiver 53 can be changed. For example, the light emitter 51 can be located above the substrate 10, and the light receiver 53 can be located under the substrate 10.

In a transmissive optical sensor, the light emitter 51 emits light to an object, and the light receiver 53 receives the light that transmits through the object. Here, the amount of the light received by the light receiver 53 is measured to sense the transmittance of the object. In embodiments of the present invention, light L emitted from the light emitter 51 passes through the substrate 10 and a corresponding one of the transmittance measurement pattern units 23, to be received by the light receiver 53. The amount of the light received by the light receiver 53 may be measured to obtain a transmittance measurement value for defect detection.

The light L emitted from the light emitter 51 toward a corresponding one of the transmittance measurement pattern units 23 may be normal or perpendicular to the substrate 10. However, the present invention is not limited thereto, and the light L may also be emitted at an angle to the substrate 10, for example.

In embodiments of the present invention, if the transmittance measurement value obtained using the light emitter 51 and the light receiver 53 is less than a set value or within a set abnormal range, it may be determined that a defect has occurred in the display substrate. In these embodiments, the occurrence of the defect may be visually or acoustically conveyed to a worker by outputting an alarm signal, for example, by sounding an alarm signal or turning on a warning light. Accordingly, the worker may recognize the alarm signal and take follow-up measures, for example, by eliminating the defective substrate 10 from a normal process line. More details can be found in the description of FIG. 3.

The above-described transmittance measurement process may be performed within a deposition chamber directly (e.g. immediately) after the process of depositing the conductive material M2 for forming the conductive layer 223 (see FIG. 7), as shown in FIG. 9. In one embodiment, the mask 40 used to deposit the conductive material M2 (see FIG. 7) includes the openings 41 at positions respectively corresponding to the transmittance measurement pattern units 23. Therefore, the light L emitted from the light emitter 51 during the transmittance measurement process may pass through a corresponding one of the openings 41 of the mask 40 and then transmit through a corresponding one of the transmittance measurement pattern units 23 and the substrate 10 to be received by the light receiver 53. In this way, a transmittance measurement value can be obtained.

If transmittance is measured within the deposition chamber directly (e.g. immediately) after the process of depositing the conductive material M2 as shown in FIG. 9, the occurrence of a defect due to the deposition of the conductive material M2 can be detected rapidly. In addition, the light emitter 51 and the light receiver 53 can be used as a sensor that detects the presence of the substrate 10 before the deposition process. Since the light emitter 51 and the light receiver 53 can also be used as a sensor that detects the presence of the substrate 10, a production facility can be further simplified. Furthermore, since, in some embodiments, additional equipment is not required due to the simplified production facility, more space within the deposition chamber can be used, production facility costs can be reduced, and/or the size of the deposition chamber can be reduced.

In some embodiments, the above-described transmittance measurement process may also be performed while the substrate 10 is being transferred after the deposition process of the conductive material M2 for forming the conductive layer 223. For example, the transmittance measurement process may be performed within a buffer chamber or a cluster chamber after the deposition process of the conductive material M2 for forming the conductive layer 223. That is, a location at which the transmittance measurement process is performed is not specifically limited.

Figure 11:
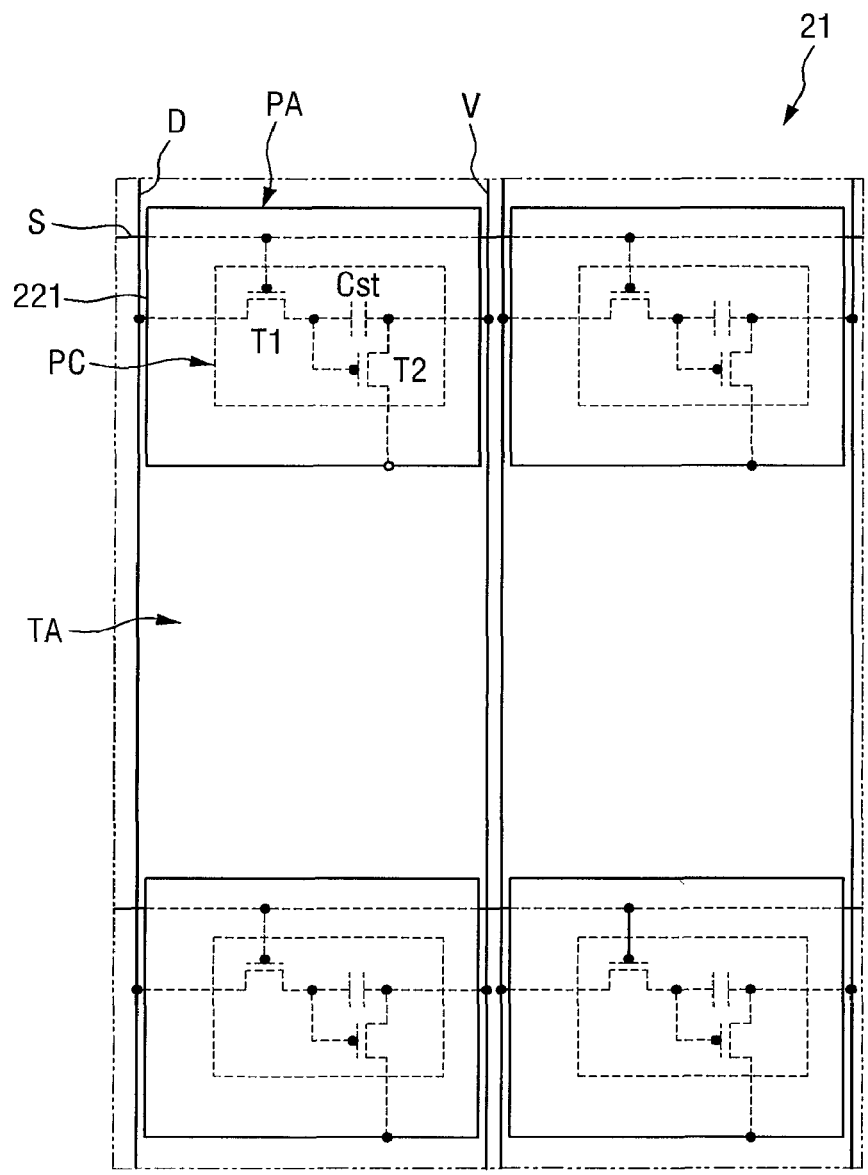
FIG. 11 is a plan view of an OLED unit according to another embodiment of the present invention.
Figure 12:
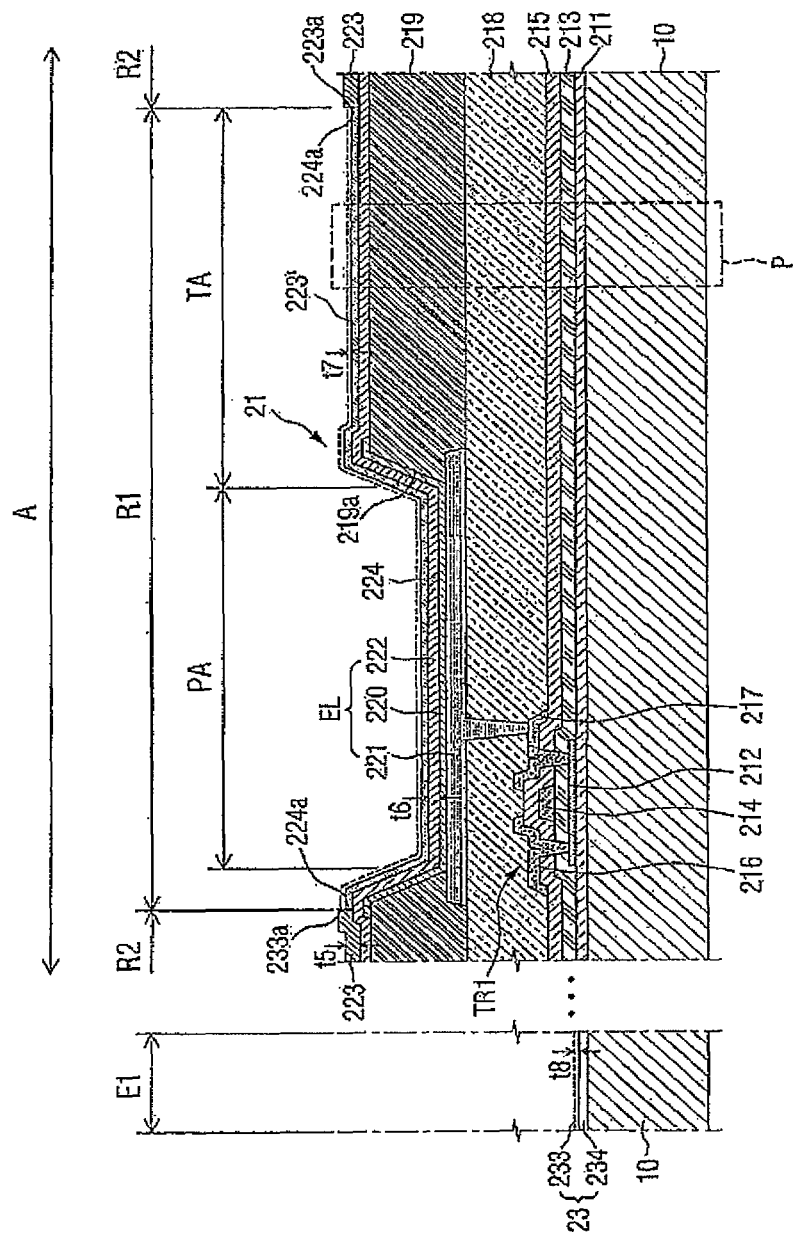
FIG. 12 is a cross-sectional view of the OLED unit and a transmittance measurement pattern unit according to the embodiment of FIG. 11.

FIG. 11 is a plan view of an OLED unit 21 of a display substrate according to another embodiment of the present invention. FIG. 12 is a cross-sectional view of one pixel included in the OLED unit 21 of FIG. 11.

Referring to FIGS. 11 and 12, the OLED unit 21 according to one embodiment includes a transmission region TA, which transmits external light and a plurality of pixel regions PA, separated from each other by the transmission region TA interposed therebetween.

Referring to FIG. 11, a pixel circuit unit PC may be located in each of the pixel regions PA, and a plurality of conductive lines including a scan line S, a data line D and a Vdd line V may be electrically connected to the pixel circuit unit PC. In some embodiments, various conductive lines in addition to the scan line S, the data line D and the Vdd line V (i.e., a driving power source) may further be provided depending on a configuration of the pixel circuit unit PC.

As shown in FIG. 11, the pixel circuit unit PC may include a first TFT T1 connected to the scan line S and the data line D, a second TFT T2 connected to the first TFT T1 and the Vdd line V, and a capacitor Cst connected to the first TFT T1 and the second TFT T2. Here, the first TFT T1 may serve as a switching transistor, and the second TFT T2 may serve as a driving transistor. The second TFT T2 may be electrically connected to a first electrode 221. In FIG. 11, the first TFT T1 and the second TFT T2 are of a P type. However, embodiments of the present invention are not limited thereto, for example, at least one of the first TFT T1 and the second TFT T2 may be of an N type. The number of TFTs and the number of capacitors are not limited to those shown in the embodiment of FIG. 11. A combination of two or more TFTs and one or more capacitors may also be provided depending on a configuration of the pixel circuit unit PC.

In FIG. 11, the scan line S overlaps the first electrode 221. However, embodiments of the present invention are not limited thereto, for example, at least one of the conductive lines including the scan line S, the data line D and the Vdd line V may overlap the first electrode 221. In some embodiments, all of the conductive lines including the scan line S, the data line D and the Vdd line V may overlap the first electrode 221 or may be placed next to the first electrode 221. That is, the positional relationship between the first electrode 221 and the conductive lines including the scan line S, the data line D and the Vdd line V is not specifically limited.

According to some embodiments, the pixel regions PA and the transmission region TA are separated from each other. Therefore, in these embodiments, when an external image is viewed via the transmission region TA, distortion of the external image due to scattered external light can be prevented or reduced.

The pixel regions PA and the transmission region TA may be formed such that a ratio of an area of the transmission region TA to a total area of the pixel regions PA and the transmission region TA is in a range of 5 to 90%.

When the ratio of the area of the transmission region TA to the total area of the pixel regions PA and the transmission region TA is less than 5%, only a small amount of light can pass through the OLED unit 21. Thus, it can be difficult for a user to view an object or image which is positioned on an opposite side. That is, the OLED unit 21 may not be recognized as transparent by the user. However, when the ratio of the area of the transmission region TA to the total area of the pixel regions PA and the transmission region TA is about 5%, if the intensity of actual external light is great, a user may fully recognize an object or image, which is positioned on the opposite side, via a display. Consequently, the user may recognize the display as a transparent display. Further, if a TFT included in the pixel circuit unit PC is formed as a transparent TFT such as an oxide semiconductor, and if an OLED EL is formed as a transparent device, a recognition level of a transparent display may increase.

When the ratio of the area of the transmission region TA to the total area of the pixel regions PA and the transmission region TA is greater than 90%, pixels per inch (PPI) of the OLED unit 21 may be significantly decreased such that it is difficult to realize a stable image via light emission in the pixel regions PA. That is, as the area of the pixel regions PA decreases, the luminance of light emitted from an organic layer 220 should be increased so as to provide an image. However, if the OLED EL is operated in a high-luminance state, its lifetime may be reduced.

In this regard, the ratio of the area of the transmission region TA to the total area of the pixel regions PA and the transmission region TA may be in a range of 20 to 70%.

In a range below 20%, the area of the pixel regions PA is too large, compared to the area of the transmission region TA. Therefore, a user may have limitations in viewing an external image via the transmission region TA. In a range above 70%, there are many restrictions on the design of the pixel circuit unit PC which is to be disposed in each of the pixel regions PA.

The first electrode 221 electrically connected to the pixel circuit unit PC may be provided in each of the pixel regions PA, and the pixel circuit unit PC may be overlapped by the first electrode 221 such that it is hidden by the first electrode 221. In addition, at least one of the conductive lines including the scan line S, the data line D and the Vdd line V may pass the first electrode 221. Since the conductive lines do not significantly deteriorate transmittance, compared to the pixel circuit unit PC, all of the conductive lines may be disposed adjacent to the first electrode 221 depending on design conditions.

As described above, if the first electrode 221 is formed as a reflective electrode including a reflective layer, it may hide the pixel circuit unit PC and prevent or reduce the distortion of an external image due to the pixel circuit unit PC in each of the pixel regions PA.

In an embodiment, and where the first electrode 221 is formed as a reflective electrode, light emitted from a pixel proceeds only toward an observer. Therefore, an amount of light lost in a direction away from the observer can be reduced. In addition, since in some embodiments the first electrode 221 hides various patterns of the pixel circuit unit PC disposed thereunder, the observer can see a clearer transmission image.

Referring to FIG. 12, the pixel region PA and the transmission region TA may be located within a first region R1.

In this embodiment, since a deposition assistant layer 224 is located within the first region R1, it covers both the pixel region PA and the transmission region TA. In addition, a conductive layer 223 may be disposed in a second region R2 outside the first region R1.

A thickness t5 of the conductive layer 223 may be greater than a thickness t6 of a second electrode 222, as described above with reference to FIG. 3.

Since the deposition assistant layer 224 is formed of a transparent organic material as described above with reference to FIG. 3, it may not affect light transmittance in the transmission region TA. Details about the materials that form the deposition assistant layer 224 and the conductive layer 223 and methods of forming the deposition assistant layer 224 and the conductive layer 223 have been described above with reference to FIG. 3.

A buffer layer 211, a gate insulating layer 213, an interlayer insulating film 215, a first insulating layer 218 and a second insulating layer 219 may be formed of a transparent insulating layer. Here, a substrate 10 may have transmittance less than or equal to total transmittance of the above insulating layers.

In one embodiment, a transmissive window may be formed in the transmission region TA by removing a portion of the second electrode 222, thereby further increasing light transmittance in the transmission region TA. Here, the transmissive window may be formed not only by removing the second electrode 222 but also by further removing at least one of the second insulating layer 219, the first insulating layer 218, the interlayer insulating film 215, the gate insulating layer 213 and the buffer layer 211.

A conductive layer thin film 223' may further be formed on the deposition assistant layer 224 in the process of forming the conductive layer 223. A thickness t7 of the conductive layer thin film 223' may be smaller than a thickness t5 of the conductive layer 223, as described above with reference to FIG. 3.

A transmittance measurement pattern unit 23 may be formed on a region E1 of an inactive area E (see FIG. 1) of the substrate 10. The transmittance measurement pattern unit 23 may include a deposition assistant layer pattern 234 formed on the substrate 10 and may further include a conductive layer pattern 233 formed on the deposition assistant layer pattern 234. The thickness t7 of the conductive layer thin film 223' can be estimated from a thickness t8 of the conductive layer pattern 233. Therefore, a transmittance defect of the display substrate can be detected based on a measured transmittance value of the transmittance measurement pattern unit 23, as described above with reference to FIG. 3.

In one embodiment, the transmittance measurement pattern unit 23 further includes a buffer layer pattern, a gate insulating layer pattern, an interlayer insulating film pattern, a first insulating layer pattern, a second insulating layer pattern, and a second electrode pattern between the deposition assistant layer pattern 234 and the substrate 10. That is, the transmittance measurement pattern unit 23 may have a same stacked structure as a portion P of the transmission region TA of FIG. 12, or any one of the above patterns can be omitted.

Figure 13:
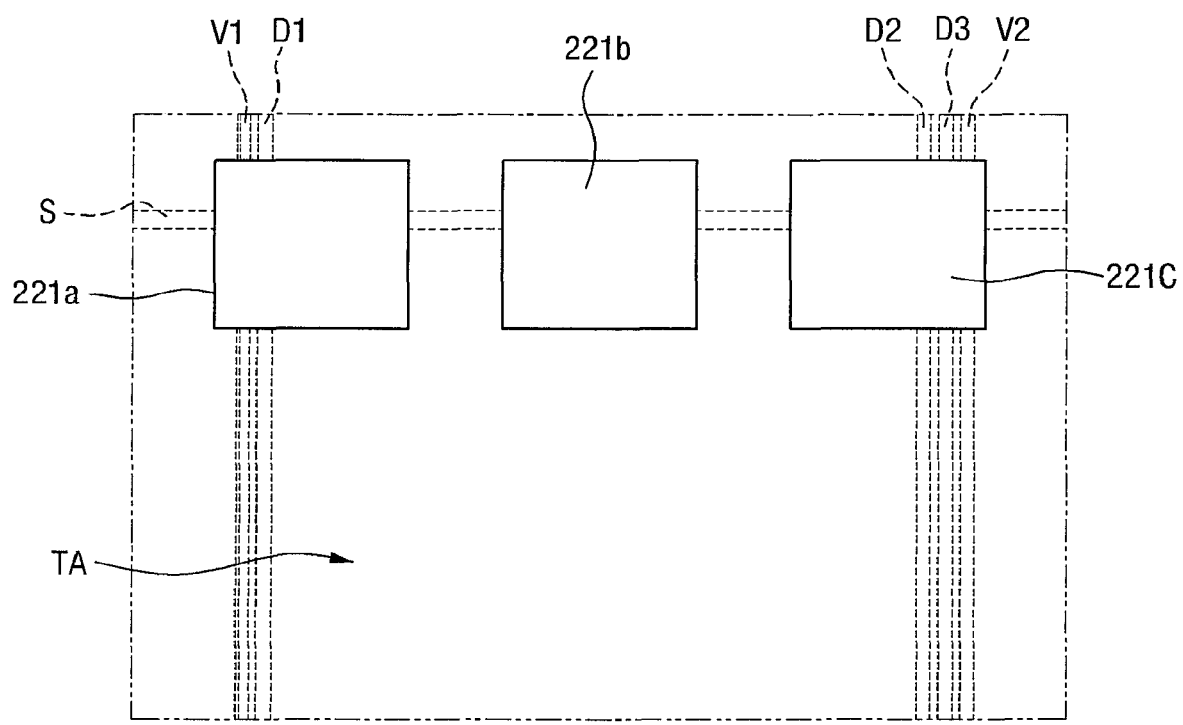
FIG. 13 is a plan view of an OLED unit according to another embodiment of the present invention.

FIG. 13 illustrates another embodiment of the OLED unit 21 shown in FIGS. 11 and 12.

The embodiment of FIG. 13 includes embodiments where one pixel includes red, green and blue sub-pixels to emit white light. The embodiment of FIG. 13 also includes embodiments where white light is emitted by sub-pixels having colors other than red, green, and blue.

In this structure, one transmission region TA may be formed for each group of first electrodes 221a through 221c of three sub-pixels. In one embodiment, first through third data lines D1 through D3 are electrically connected to the first electrodes 221a through 221c of the three sub-pixels, respectively. Also, a first Vdd line V1 may be electrically connected to the first and second first electrodes 221a and 221b, and a second Vdd line V2 may be electrically connected to the third first electrode 221c.

In this structure, since one large transmission region TA is formed for a plurality of sub-pixels, transmittance of the entire display may be further increased, and image distortion due to scattered light may be further decreased.

In one embodiment, one large transmissive window may be formed in the transmission region TA by removing a portion of at least a second electrode. Here, the transmissive window may be formed not only by removing the second electrode but also by further removing at least one of a second insulating layer, a first insulating layer, an interlayer insulating film, a gate insulating layer, and a buffer layer.

Aspects of embodiments of the present invention are directed to a display substrate, in which a voltage drop in a second electrode due to the formation of a conductive layer can be prevented or reduced.

Aspects of embodiments of the present invention are directed toward a display substrate and method of making the same, in which an organic layer and/or a second electrode can be prevented from being damaged (or damage to the organic layer and/or the second electrode can be reduced) during a process of forming the conductive layer, and the conductive layer can be formed by a simpler process, which, in turn, improves process efficiency.

Aspects of embodiments of the present invention are directed toward a display substrate and method of making the same, in which a defect resulting from a deposition defect that may occur during the process of forming the conductive layer can be detected more easily and rapidly.

However, aspects of embodiments of the present invention are not limited to those specifically set forth herein, as will become more apparent to one of ordinary skill in the art to which the present invention pertains.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof. It will be understood by those of ordinary skill in the art that various changes in form and detail may be made without departing from the spirit and scope of the present invention and the embodiments should be considered in a descriptive sense only and not for purposes of limitation.

What is claimed is:

1. A method of manufacturing a display substrate, the method comprising:
    forming a TFT on a substrate, the substrate comprising an active area and an inactive area, the forming of the TFT being on the active area of the substrate;
    forming an OLED electrically connected to the TFT and comprising a first electrode, an organic light-emitting layer and a second electrode;
    concurrently or simultaneously forming a deposition assistant layer on a first region of the second electrode with a deposition assistant layer pattern on the inactive area of the substrate;
    concurrently or simultaneously forming a conductive layer electrically connected to the second electrode, the forming of the conductive layer comprising depositing a conductive material on a second region of the second electrode, which excludes the first region, with a transmittance measurement pattern unit, the depositing of the transmittance measurement pattern unit comprising depositing the conductive material on the deposition assistant layer pattern; and
    measuring transmittance of the transmittance measurement pattern unit to determine whether a defect is present.

2. The method of claim 1, wherein the forming of the deposition assistant layer and the deposition assistant layer pattern comprises using a mask having openings corresponding to regions in which the deposition assistant layer and the deposition assistant layer pattern are to be formed.

3. The method of claim 1, wherein the forming of the conductive layer and the transmittance measurement pattern unit comprises using a mask having openings corresponding to the active area and the transmittance measurement pattern unit.

4. The method of claim 1, wherein the measuring of the transmittance is performed directly after the forming of the conductive layer.

5. The method of claim 1, wherein the measuring of the transmittance is performed within a deposition chamber in which the conductive material is deposited.

6. The method of claim 1, wherein the measuring of the transmittance is performed while the substrate having the conductive material deposited thereon is being transferred.

7. The method of claim 1, wherein the measuring of the transmittance comprises:
    irradiating light to the transmittance measurement pattern with a light emitter on a first side of the substrate; and
    receiving light transmitted through the substrate and the transmittance measurement pattern with a light receiver on a second side of the substrate, facing oppositely away from the first side.

8. The method of claim 7, wherein light irradiated from the light emitter to the transmittance measurement pattern unit is perpendicular to the substrate.

9. The method of claim 1, wherein the second electrode is formed as a light-transmissive thin film.

10. The method of claim 1, wherein the second electrode comprises a metal selected from Ag, Mg, Al, Pt, Pd, Au, Ni, Nd, Ir, Cr, Li, Ca, and an alloy thereof.

11. The method of claim 1, wherein the conductive material comprises Mg.

12. The method of claim 1, wherein a thickness of the conductive layer is equal to or greater than a thickness of the second electrode.

13. The method of claim 1, wherein the deposition assistant layer and the deposition assistant layer pattern comprises a light-transmitting material.

14. The method of claim 1, wherein the deposition assistant layer and the deposition assistant layer pattern comprise 8-quinolinolato lithium, N,N-diphenyl-N,N-bis(9-phenyl-9H-carbazol-3-yl)biphenyl-4,4'-diamine, N(diphenyl-4-yl)9,9-dimethyl-N-(4(9-phenyl-9H-carbazol-3-yl)phenyl)-9H-fluorene-2-amine, or 2-(4-(9,10-di(naphthalene-2-yl)anthracene-2-yl)phenyl)-1-phenyl-1H-benzo-[D]imidazole.

15. The method of claim 1, wherein adhesion between the conductive layer and the deposition assistant layer is weaker than adhesion between the conductive layer and the second electrode.

16. The method of claim 1, wherein the active area comprises a transmission region configured to transmit external light and a pixel region adjacent to the transmission region, wherein all or part of the transmission region and the pixel region are located in the first region of the second electrode, and wherein the first electrode is formed to overlap the pixel region.

17. The method of claim 16, wherein the first electrode is formed to overlap and hide the TFT.

18. The method of claim 17, wherein the transmission region is formed such that a ratio of an area of the transmission region to the sum of an area of the pixel region and the area of the transmission region is in a range of 5 to 90%.

19. The method of claim 1, further comprising outputting an alarm signal based on detection of the defect.

* * * * *